United States Patent
Mine et al.

(10) Patent No.: US 11,887,873 B2
(45) Date of Patent: Jan. 30, 2024

(54) WAFER PLACEMENT APPARATUS

(71) Applicant: NGK INSULATORS, LTD., Nagoya (JP)

(72) Inventors: Keita Mine, Handa (JP); Takumi Wakisaka, Takahama (JP)

(73) Assignee: NGK INSULATORS, LTD., Nagoya (JP)

(*) Notice: Subject to any disclaimer, the term of this patent is extended or adjusted under 35 U.S.C. 154(b) by 254 days.

(21) Appl. No.: 16/822,541

(22) Filed: Mar. 18, 2020

(65) Prior Publication Data
US 2020/0312684 A1 Oct. 1, 2020

(30) Foreign Application Priority Data
Mar. 26, 2019 (JP) .................................. 2019-058284

(51) Int. Cl.
*H01L 21/67* (2006.01)
*H01L 21/673* (2006.01)
(Continued)

(52) U.S. Cl.
CPC ...... *H01L 21/67109* (2013.01); *H01L 21/673* (2013.01); *H01L 21/6833* (2013.01);
(Continued)

(58) Field of Classification Search
None
See application file for complete search history.

(56) References Cited

U.S. PATENT DOCUMENTS

| 5,846,375 A * | 12/1998 | Gilchrist | ........... H01J 37/32724 |
| | | | 118/724 |
| 2004/0097088 A1* | 5/2004 | Kitayama | ......... H01L 21/67109 |
| | | | 156/345.1 |

(Continued)

FOREIGN PATENT DOCUMENTS

| CN | 101345188 A | 1/2009 |
| JP | 2005-209981 A | 8/2005 |

(Continued)

OTHER PUBLICATIONS

Korean Office Action (Application NO. 10-2020-0033733) dated Jul. 2, 2021 (with English translation).

(Continued)

*Primary Examiner* — Jeffrie R Lund
*Assistant Examiner* — Tiffany Z Nuckols
(74) *Attorney, Agent, or Firm* — BURR PATENT LAW, PLLC

(57) ABSTRACT

A wafer placement apparatus includes a ceramic plate having an upper surface as a wafer placement surface and in which an electrode is embedded; and a cooling plate provided on a lower surface, opposite a wafer placement surface, of a ceramic plate and in which a refrigerant passage is provided, wherein a refrigerant passage includes a first passage forming a single continuous line and extending parallel to a wafer placement surface, and a second passage forming a single continuous line and extending along a first passage, an outlet of a second passage being positioned near an inlet of a first passage, an inlet of a second passage being positioned near an outlet of a first passage.

6 Claims, 4 Drawing Sheets

(51) Int. Cl.
*H01L 21/683* (2006.01)
*H01B 3/28* (2006.01)
*H05B 3/28* (2006.01)

(52) U.S. Cl.
CPC ......... *H01L 21/6835* (2013.01); *H05B 3/283* (2013.01); *H05B 2203/016* (2013.01); *H05B 2203/017* (2013.01)

(56) References Cited

U.S. PATENT DOCUMENTS

| | | | |
|---|---|---|---|
| 2004/0244945 A1 | 12/2004 | Lee et al. | |
| 2007/0039942 A1* | 2/2007 | Leung | C23C 16/463 219/443.1 |
| 2009/0014431 A1* | 1/2009 | Oh | H01L 21/67109 219/444.1 |
| 2010/0193501 A1* | 8/2010 | Zucker | H01L 21/67248 219/443.1 |
| 2011/0180243 A1* | 7/2011 | Bera | F28F 3/12 165/168 |
| 2013/0112383 A1 | 5/2013 | Hanamachi | |
| 2013/0284372 A1* | 10/2013 | Tavassoli | H01L 21/6831 219/121.14 |
| 2015/0376783 A1* | 12/2015 | Hanamachi | H01L 21/68785 118/500 |
| 2016/0118285 A1 | 4/2016 | Takada | |
| 2017/0133244 A1* | 5/2017 | Knyazik | F28D 7/04 |
| 2017/0280509 A1 | 9/2017 | Takebayashi | |
| 2018/0142352 A1* | 5/2018 | Shah | C23C 16/45572 |
| 2019/0326139 A1* | 10/2019 | Forderhase | H01L 21/67109 |
| 2019/0341280 A1* | 11/2019 | Arami | H01L 21/68785 |
| 2020/0066557 A1* | 2/2020 | Lee | H01L 21/6833 |

FOREIGN PATENT DOCUMENTS

| | | |
|---|---|---|
| JP | 2006-332518 A1 | 12/2006 |
| JP | 2007-053382 A | 3/2007 |
| JP | 2013-016655 A | 1/2013 |
| JP | 2013-051422 A1 | 3/2013 |
| JP | 2014-175491 A | 9/2014 |
| JP | 2016-082206 A | 5/2016 |
| JP | 6129451 B1 | 5/2017 |
| JP | 2017-183381 A1 | 10/2017 |
| KR | 10-2004-0104786 A | 12/2004 |
| KR | 10-2013-0044291 A | 5/2013 |
| KR | 10-2016-0049069 A | 5/2016 |
| KR | 10-1736363 B1 | 5/2017 |
| KR | 10-2017-0078890 A | 7/2017 |

OTHER PUBLICATIONS

Japanese Office Action (Application No. 2019-058284) dated Mar. 2, 2021 (with English translation).
Korean Office Action (Application No. 10-2020-0033733) dated Dec. 28, 2022 (with English translation).
Chinese Office Action dated Jun. 8, 2023 (Application No. 202010218460.7).

* cited by examiner

WAFER PLACEMENT APPARATUS

BACKGROUND OF THE INVENTION

1. Field of the Invention

The present invention relates to a wafer placement apparatus.

2. Description of the Related Art

A known wafer placement apparatus includes a ceramic plate having an upper surface serving as a wafer placement surface; and a cooling plate provided on a lower surface, opposite the wafer placement surface, of the ceramic plate and in which a refrigerant passage is provided. For example, a cooling plate is disclosed by PTL 1 that has a refrigerant passage running over the entirety thereof. A cooling device is connected to the inlet and the outlet of the refrigerant passage. Refrigerant supplied from the cooling device enters the inlet of the refrigerant passage, flows through the refrigerant passage, exits the outlet of the refrigerant passage, returns into the cooling device, is cooled to a preset temperature in the cooling device, and re-enters the inlet of the refrigerant passage.

PATENT LITERATURE

PTL 1: Japanese Patent No. 6129451

SUMMARY OF THE INVENTION

While the refrigerant supplied into the refrigerant passage is flowing through the refrigerant passage, the refrigerant continues to be heated by exchanging heat with the ceramic plate. Therefore, the refrigerant in the refrigerant passage exhibits a temperature gradient ascending as the refrigerant flows from the inlet toward the outlet of the refrigerant passage. The greater the length of one refrigerant passage, the greater the distance over which the refrigerant flows while exchanging heat with the ceramic plate. Therefore, if the other conditions are fixed, the greater the length of one refrigerant passage, the higher the temperature of the refrigerant becomes near the outlet of the refrigerant passage. The cooling plate of the wafer placement apparatus according to PTL 1 has one refrigerant passage with one inlet and one outlet. In such a case, the one refrigerant passage is long, and the refrigerant has a high temperature near the outlet. Consequently, there is a great difference in the temperature of the refrigerant between that at the inlet and that at the outlet of the refrigerant passage. Such a situation may reduce the temperature uniformity of the cooling plate in the in-plane direction. Therefore, if such a wafer placement apparatus is employed, the temperature uniformity of each wafer tends to become low.

The present invention is to solve the above problem, and the chief object of the present invention is to increase the temperature uniformity of each wafer.

A wafer placement apparatus according to the present invention includes:

a ceramic plate having an upper surface as a wafer placement surface and in which an electrode is embedded; and a cooling plate provided on a lower surface, opposite the wafer placement surface, of the ceramic plate and in which a refrigerant passage is provided, wherein the refrigerant passage includes a first passage forming a single continuous line and extending parallel to the wafer placement surface, and a second passage forming a single continuous line and extending along the first passage, an outlet of the second passage being positioned near an inlet of the first passage, an inlet of the second passage being positioned near an outlet of the first passage.

The above wafer placement apparatus has the refrigerant passage including the first passage and the second passage that are separate from each other. Therefore, the length of one refrigerant passage is short. Accordingly, if refrigerant cooled to a preset temperature by a cooling device or the like is supplied into each of the first and second passages, the refrigerant has a lower temperature around each of the outlets of the passages than in a case of a single refrigerant passage. Thus, the temperature difference in the cooling plate in the in-plane direction can be reduced. Furthermore, in the above wafer placement apparatus, the second passage extends along and paired with the first passage, and the inlet and the outlet of the second passage are positioned inversely with respect to those of the first passage. Therefore, the temperature gradient of the refrigerant in the first passage is offset by the temperature gradient, sloping inversely, of the refrigerant in the second passage. Consequently, the temperature difference in the cooling plate in the in-plane direction can be reduced. With such a wafer placement apparatus, the temperature uniformity of each wafer can be increased.

In this specification, the terms "upper" and "lower" do not define the absolute positional relationship but define the relative positional relationship. Therefore, depending on the orientation of the wafer placement apparatus, the "upper" side and the "lower" side may be expressed in different ways: the "lower" side and the "upper" side, the "left" side and the "right" side, or the "front" side and the "rear" side.

In the wafer placement apparatus according to the present invention, the inlet and the outlet of the first passage may be positioned close to each other, and parts of the passages in a region around the inlet and the outlet of the first passage may be arranged such that an inlet-side part of the first passage, an outlet-side part of the second passage, an inlet-side part of the second passage, and an outlet-side part of the first passage are adjacent to one another in that order. To gather tubes for supplying and discharging the refrigerant close to one another, the inlets and the outlets of the refrigerant passages are often positioned close to one another. However, if the inlet for the low-temperature refrigerant and the outlet for the high-temperature refrigerant are positioned close to each other, the temperature gradient of the cooling plate may locally become steep in a region between the inlet and the outlet that are adjacent to each other. Therefore, in the region around the inlet and the outlet of the first passage that are close to each other, parts of the passages are arranged such that the inlet-side part of the first passage, the outlet-side part of the second passage, the inlet-side part of the second passage, and the outlet-side part of the first passage are adjacent to one another in that order. In such a case, if the inlet and the outlet of the first passage are adjacent to each other, the temperature gradient of the cooling plate that may locally become steep in the region between the inlet and the outlet that are adjacent to each other is offset by the temperature gradient, sloping inversely, of the cooling plate in a region between the outlet-side part and the inlet-side part of the second passage. Consequently, the temperature difference in the cooling plate in the in-plane direction can be reduced further.

In the wafer placement apparatus according to the present invention, the first passage and the second passage may each have a swirling shape. If the passages each have a swirling shape, the outlet-side part of the passages and the inlet-side part of the passages are alternately positioned, and there is no chance that the outlet-side part of the passages is positioned adjacent to the outlet-side part of the passages, or the inlet-side part of the passages is positioned adjacent to the inlet-side part of the passages.

In the wafer placement apparatus according to the present invention, the first passage and the second passage may each swirl from the inlet in an outer peripheral part of the cooling plate to a central part of the cooling plate, make a turn in the central part, and swirl back from the turn to the outlet in the outer peripheral part; or the first passage and the second passage may each swirl from the inlet in the central part to the outer peripheral part, make a turn in the outer peripheral part, and swirl back from the turn to the outlet in the central part. In such a case, the first passage and the second passage can be formed into the respective swirling shapes such that the inlets and the outlets of the first and second passages are positioned close to one another. Furthermore, in the region around the inlet and the outlet of the first passage, parts of the passages can be arranged such that the inlet-side part of the first passage, the outlet-side part of the second passage, the inlet-side part of the second passage, and the outlet-side part of the first passage are adjacent to one another in that order. Consequently, the temperature difference in the cooling plate in the in-plane direction can be reduced further.

DETAILED DESCRIPTION OF THE INVENTION

Figure 1:
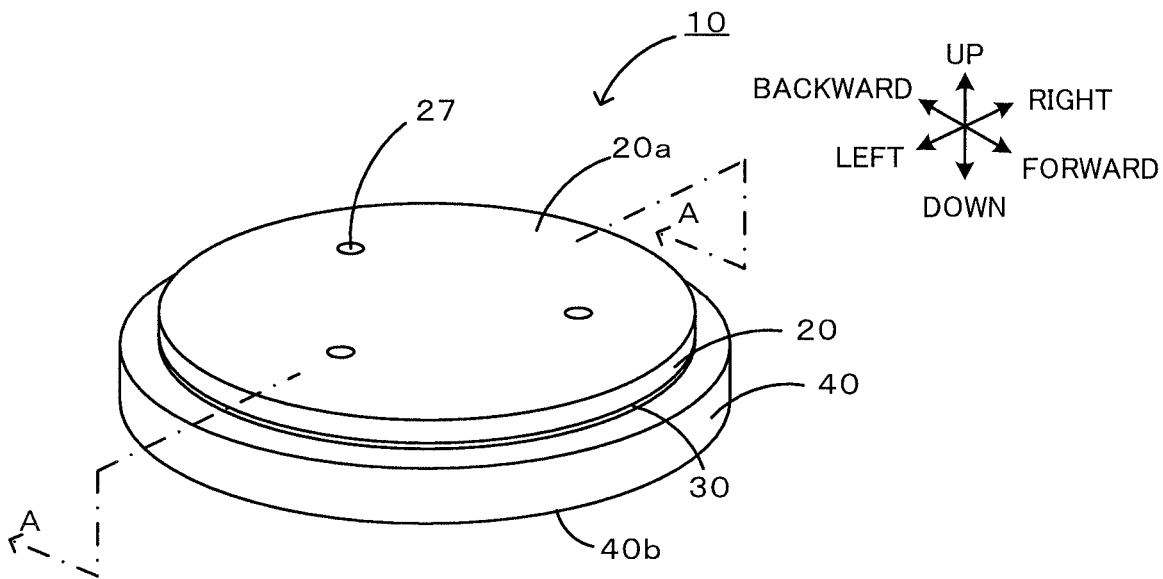
FIG. 1 is a perspective view of an electrostatic-chuck heater 10.
Figure 2:
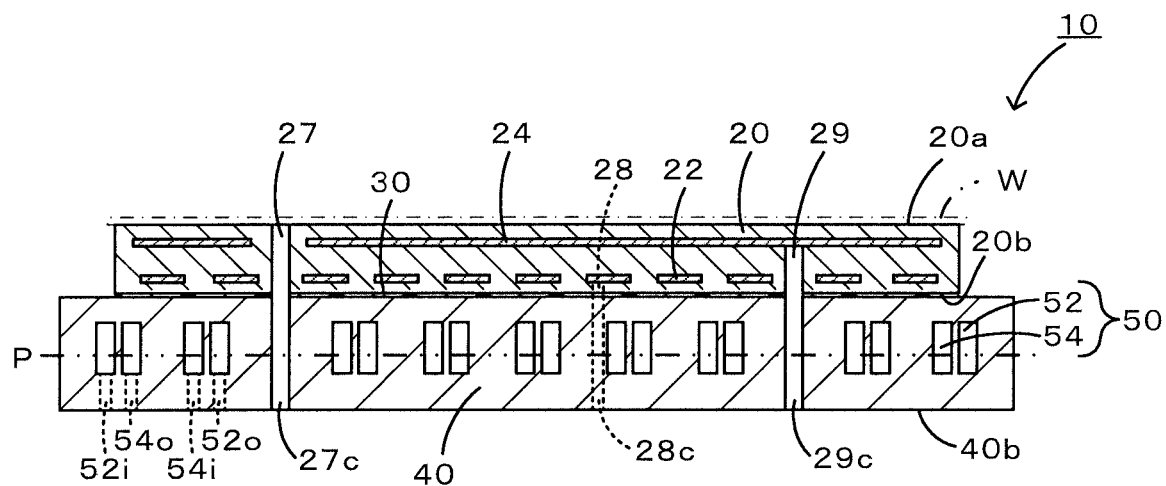
FIG. 2 is a sectional view taken along line A-A illustrated in FIG. 1.
Figure 3:
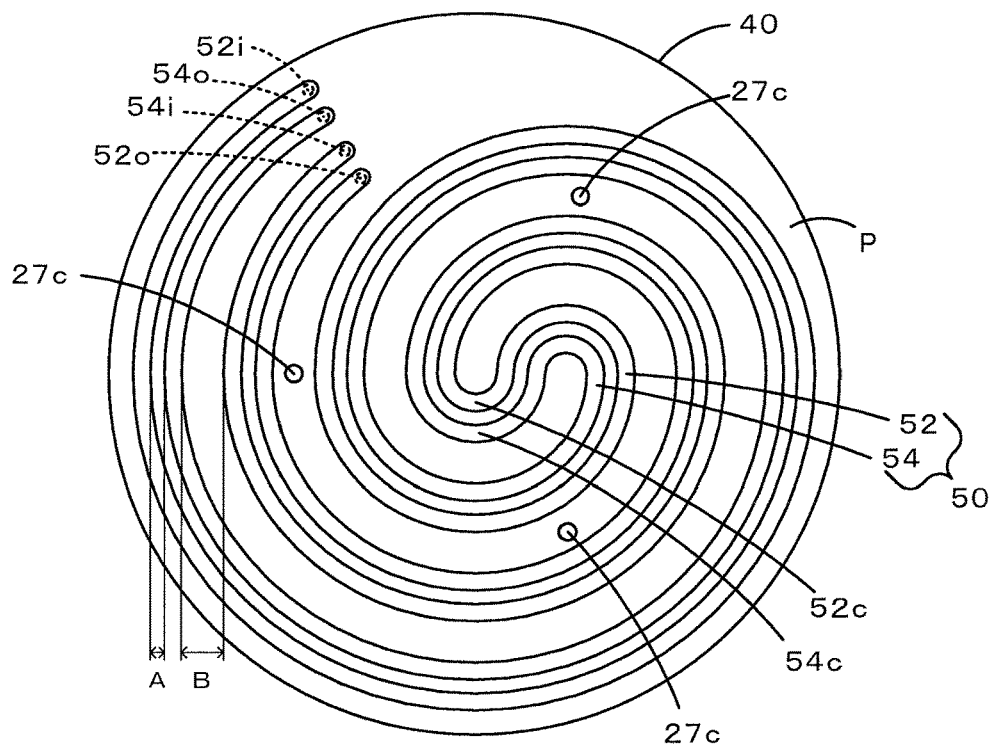
FIG. 3 is a sectional view of a cooling plate 40 taken along plane P.

Preferred embodiments of the present invention will now be described with reference to the drawings. FIG. 1 is a perspective view of an electrostatic-chuck heater 10. FIG. 2 is a sectional view taken along line A-A illustrated in FIG. 1. FIG. 3 is a sectional view of a cooling plate 40 taken along plane P. Plane P is parallel to a wafer placement surface 20a and passes through refrigerant passages 50.

The electrostatic-chuck heater 10 includes a ceramic plate 20 having an upper surface serving as the wafer placement surface 20a; and the cooling plate 40 provided on a lower surface 20b, opposite the wafer placement surface 20a, of the ceramic plate 20. The ceramic plate 20 and the cooling plate 40 are joined to each other with an insulating adhesive sheet 30. The electrostatic-chuck heater 10 has three holes 27 each extending vertically therethrough. The three holes 27 are arranged at regular intervals on a virtual circle that is concentric to the ceramic plate 20. A wafer W to be mounted on the wafer placement surface 20a of the ceramic plate 20 can be lifted up by pushing up lift pins to be inserted into the respective holes 27. The holes 27 each include a through-hole 27c extending through the cooling plate 40. The peripheral wall of each of the through-holes 27c included in the respective holes 27 is covered with an insulating material (not illustrated).

The ceramic plate 20 is a disc-shaped plate made of a ceramic material such as aluminum nitride or alumina. The ceramic plate 20 has a heater electrode 22 and an electrostatic electrode 24 embedded therein. The heater electrode 22 is formed as a coil or a printed pattern made of a material chiefly composed of, for example, molybdenum, tungsten, or tungsten carbide. The heater electrode 22 forms a single continuous line extending from one end to the other end thereof in such a manner as to run over the entirety of the disc-shaped ceramic plate 20. The one end and the other end of the heater electrode 22 are connected to a pair of power-feeding bars (not illustrated) positioned in respective holes 28 each having a mouth in a lower surface 40b of the cooling plate 40. The electrostatic electrode 24 is formed as a mesh or a plate made of a material chiefly composed of, for example, molybdenum, tungsten, or tungsten carbide. The electrostatic electrode 24 extends parallel to the wafer placement surface 20a of the ceramic plate 20. The electrostatic electrode 24 is connected to a power-feeding bar (not illustrated) positioned in a hole 29. The holes 28 and 29 are each a series of the following: a bottomed hole extending from an opening provided in the lower surface 20b of the ceramic plate 20 to the heater electrode 22 or the electrostatic electrode 24, a through-hole extending through the adhesive sheet 30, and a through-hole 28c or 29c extending vertically through the cooling plate 40. The peripheral walls of the through-holes 28c and 29c included in the respective holes 28 and 29 and extending through the cooling plate 40 are covered with an insulating material (not illustrated).

The cooling plate 40 is a disc-shaped plate made of metal such as aluminum or an aluminum alloy and has the refrigerant passages 50 provided therein. The refrigerant passages 50 extend parallel to the wafer placement surface 20a and include a first passage 52 and a second passage 54.

The first passage 52 forms a single continuous line running over the entirety of a region of the cooling plate 40 over which the ceramic plate 20 spreads. Specifically, the first passage 52 swirls from an inlet 52i in an outer peripheral part to a central part, makes a turn 52c in the central part, and swirls back to an outlet 52o in the outer peripheral part (see FIG. 3). That is, the first passage 52 has a double swirling shape. The outlet 52o is positioned near and on the inner side with respect to the inlet 52i. The inlet 52i and the outlet 52o of the first passage 52 are connected to a first cooling device (not illustrated). Refrigerant discharged from the outlet 52o undergoes temperature adjustment in the first cooling device, re-enters the inlet 52i, and flows through the first passage 52 again.

The second passage 54 forms a single continuous line running along the first passage 52. An outlet 54o of the second passage 54 is positioned adjacent to the inlet 52i of the first passage 52. An inlet 54i of the second passage 54 is positioned adjacent to the outlet 52o of the first passage 52. Specifically, the second passage 54 swirls from the inlet 54i adjacent to the outlet 52o of the first passage 52 to the central part, makes a turn 54c in the central part, and swirls back to the outlet 54o adjacent to the inlet 52i of the first passage 52 (see FIG. 3). That is, the second passage 54 has a double swirling shape. The inlet 54i and the outlet 54o of the second passage 54 are connected to a second cooling device (not illustrated). Refrigerant discharged from the outlet 54o undergoes temperature adjustment in the second cooling device, re-enters the inlet 54i, and flows through the second passage 54.

Now, a usage of the electrostatic-chuck heater 10 according to the present embodiment will be described. First, a wafer W is mounted on the wafer placement surface 20a of the electrostatic-chuck heater 10, and a voltage is applied to the electrostatic electrode 24, whereby the wafer W is attracted to the ceramic plate 20 with an electrostatic force. In this state, a process such as plasma CVD or plasma etching is performed on the wafer W. In this step, the temperature of the wafer W is controlled by heating the wafer W while applying a voltage to the heater electrode 22 or by cooling the wafer W while causing refrigerant, such as water, to circulate through the refrigerant passages 50 in the cooling plate 40. The first passage 52 and the second passage 54 included in the refrigerant passages 50 are connected to the respective cooling devices, i.e. the first cooling device and the second cooling device. Therefore, the refrigerant temperature in the first passage 52 and the refrigerant temperature in the second passage 54 are controlled independently of each other. When the processing of the wafer W is finished, the voltage applied to the electrostatic electrode 24 is reduced to zero to remove the electrostatic force. Then, the lift pins (not illustrated) inserted into the holes 27 are pushed up, whereby the wafer W is lifted up from the wafer placement surface 20a of the ceramic plate 20 by the lift pins. The wafer W thus lifted up by the lift pins is transported to another place by a transporting device (not illustrated).

The electrostatic-chuck heater 10 according to the above embodiment has the refrigerant passages 50 including the first passage 52 and the second passage 54 that are separate from each other. Therefore, the length of one refrigerant passage is short. Accordingly, if refrigerant cooled to a preset temperature by a cooling device or the like is supplied into each of the first and second passages 52 and 54, the refrigerant has a lower temperature around each of the outlets 52o and 54o of the first and second passages 52 and 54 than in a case of a single refrigerant passage 50 (for example, a case where the outlet 52o of the first passage 52 and the inlet 54i of the second passage 54 are connected to each other to form a single refrigerant passage). Thus, the temperature difference in the cooling plate 40 in the in-plane direction can be reduced. Furthermore, the second passage 54 extends along and paired with the first passage 52, and the inlet and the outlet of the second passage 54 are positioned inversely with respect to the inlet and the outlet of the first passage 52. Therefore, the temperature gradient of the refrigerant in the first passage 52 is offset by the temperature gradient, sloping inversely, of the refrigerant in the second passage 54. Consequently, the temperature difference in the cooling plate 40 in the in-plane direction can be reduced. With such a wafer placement apparatus, the temperature uniformity of the wafer W can be increased.

In the electrostatic-chuck heater 10 according to the present embodiment, the inlets 52i and 54i and the outlets 52o and 54o of the first and second passages 52 and 54 are all positioned close to one another. Therefore, tubes for supplying and discharging the refrigerant can be gathered close to one another. Furthermore, in a region around the inlet 52i and the outlet 52o of the first passage 52, a part of the first passage 52 that is on a side nearer to the inlet 52i, a part of the second passage 54 that is on a side nearer to the outlet 54o, a part of the second passage 54 that is on a side nearer to the inlet 54i, and a part of the first passage 52 that is on a side nearer to the outlet 52o are adjacent to one another in that order. If the inlet 52i and the outlet 52o of the first passage 52 are adjacent to each other, the temperature gradient of the cooling plate 40 may locally become steep in a region between the two. However, such a temperature gradient is offset by the temperature gradient, sloping inversely, of the cooling plate 40 in a region between the part of the second passage 54 that is on the side nearer to the outlet 54o and the part of the second passage 54 that is on the side nearer to the inlet 54i. Consequently, the temperature difference in the cooling plate 40 in the in-plane direction can be reduced further.

The first and second passages 52 and 54 of the electrostatic-chuck heater 10 according to the present embodiment each have a swirling shape. Therefore, the outlet-side part of the passages and the inlet-side part of the passages are alternately positioned, and there is no chance that the outlet-side part of the passages are positioned adjacent to the outlet-side part of the passages, or the inlet-side part of the passages are positioned adjacent to the inlet-side part of the passages. In such an arrangement, refrigerant flowing in the outlet-side part of the passages and having a relatively high temperature exchanges heat with and is thus cooled by refrigerant flowing in the inlet-side part of the passages adjacent to the outlet-side part of the passages and having a relatively low temperature. Therefore, the temperature of the refrigerant in the outlet-side part of the passages becomes closer to the temperature of the refrigerant in the inlet-side part of the passages than in a case where the outlet-side parts of the two respective passages are adjacent to each other, or in a case where the outlet-side part of the one passage is adjacent to the outlet-side part. Conversely, refrigerant flowing in the inlet-side part of the passages and having a relatively low temperature exchanges heat with and is thus heated by refrigerant flowing in the outlet-side part of the passages adjacent to the inlet-side part of the passages and having a relatively high temperature. Therefore, the temperature of the refrigerant in the inlet-side part of the passages becomes closer to the temperature of the refrigerant in the outlet-side part of the passages than in a case where the inlet-side parts of the two respective passages are adjacent to each other, or in a case where the inlet-side part of the one passage is adjacent to the inlet-side part. Consequently, the temperature difference in the cooling plate 40 in the in-plane direction can be reduced further. Moreover, since the first and second passages 52 and 54 each have a swirling shape, the passages can be arranged with a small number of turns while running over the entirety of the region over which the ceramic plate 20 spreads. Consequently, the refrigerant in each of the passages can be made to flow smoothly.

The first and second passages 52 and 54 of the electrostatic-chuck heater 10 according to the present embodiment each have a double swirling shape. Therefore, in forming the first and second passages 52 and 54 into the respective swirling shapes, the inlets 52i and 54i and the outlets 52o and 54o of the first and second passages 52 and 54 can be positioned close to one another. Furthermore, in the region around the inlet 52i and the outlet 52o of the first passage 52, the part of the first passage 52 that is on the side nearer to the inlet 52i, the part of the second passage 54 that is on the side nearer to the outlet 54o, the part of the second passage 54 that is on the side nearer to the inlet 54i, and the part of the first passage 52 that is on the side nearer to the outlet 52o can be positioned adjacent to one another in that order. Therefore, the temperature difference in the cooling plate 40 in the in-plane direction can be reduced further.

The present invention is not limited to the above embodiment in any way and can be embodied in various ways within the technical scope thereof, of course.

Figure 4:
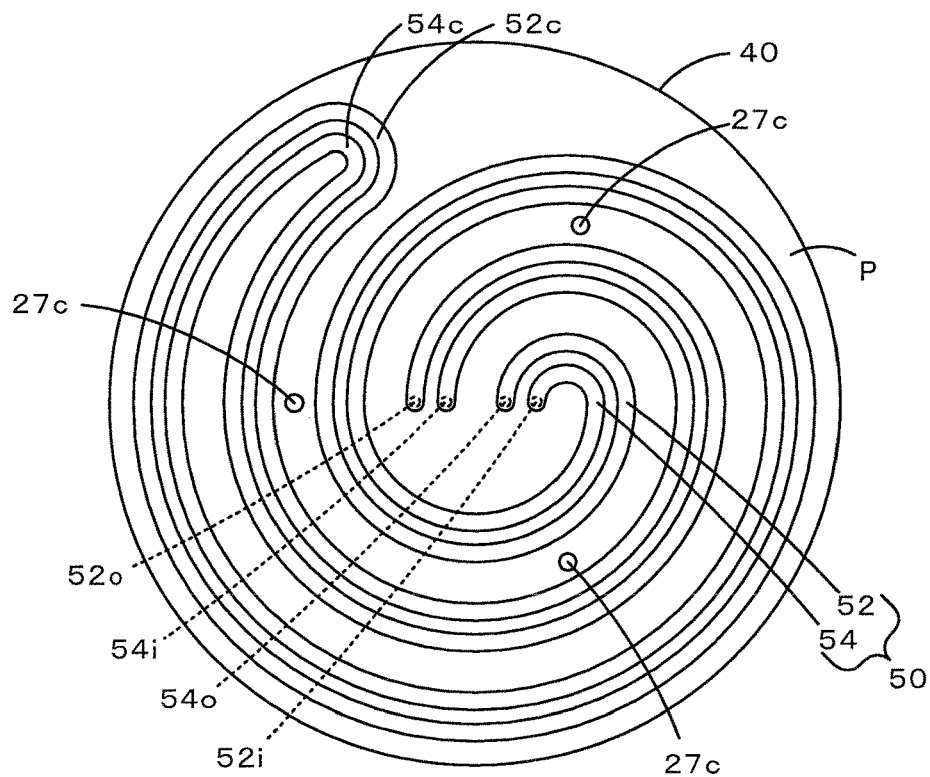
FIG. 4 is a sectional view of a modification of the cooling plate 40 taken along plane P.

For example, as illustrated in FIG. 4, the above embodiment may be modified such that the first passage 52 have the turn 52c in the outer peripheral part and the inlet 52i and the outlet 52o in the central part. In such a case, the second passage 54 only needs to have the turn 54c in the outer peripheral part and the inlet 54i and the outlet 54o in the central part.

Figure 5:
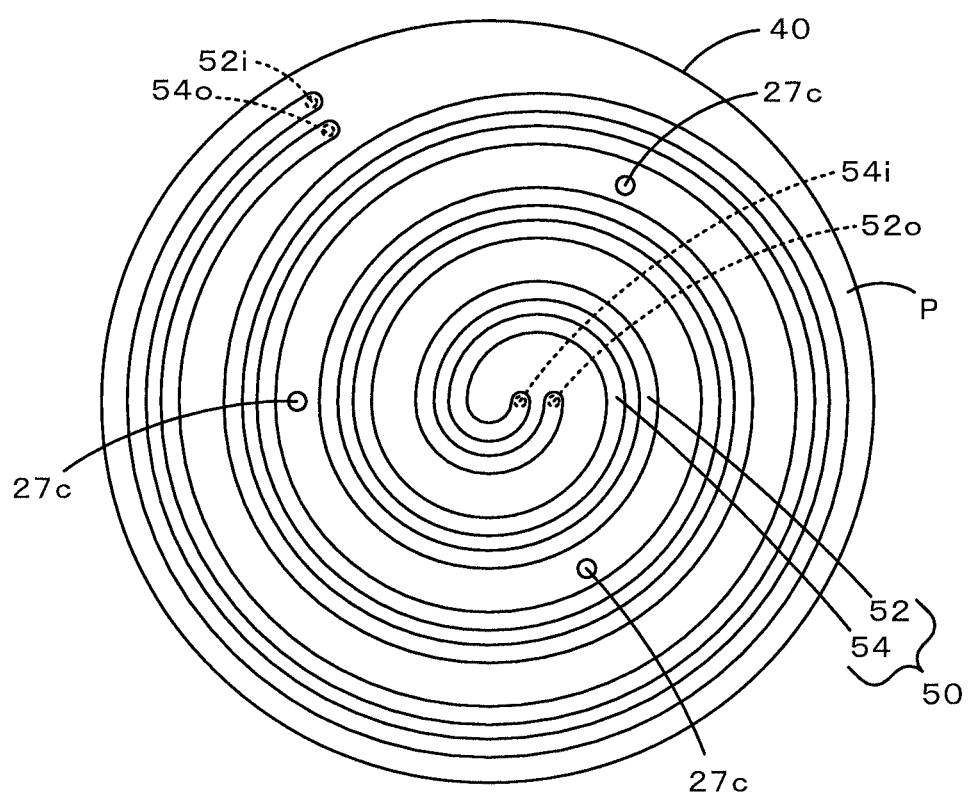
FIG. 5 is a sectional view of another modification of the cooling plate 40 taken along plane P.

The above embodiment may be modified such that, as illustrated in FIG. 5, the first and second passages 52 and 54 each have a single swirling shape. In FIG. 5, the first passage 52 has a single swirling shape extending from the inlet 52i in the outer peripheral part to the outlet 52o in the central part, and the second passage 54 has a single swirling shape extending along the first passage 52 from the inlet 54i in the central part to the outlet 54o in the outer peripheral part. In such an arrangement as well, the outlet-side part of the passages and the inlet-side part of the passages are alternately positioned. Therefore, the temperature difference in the cooling plate 40 in the in-plane direction can be made smaller than in a case where the outlet-side part of the passages is positioned adjacent to the outlet-side part of the passages or a case where the inlet-side part of the passages is positioned adjacent to the inlet-side part of the passages. Moreover, the first and second passages 52 and 54 may each have a triple or more swirling shape.

Figure 6:
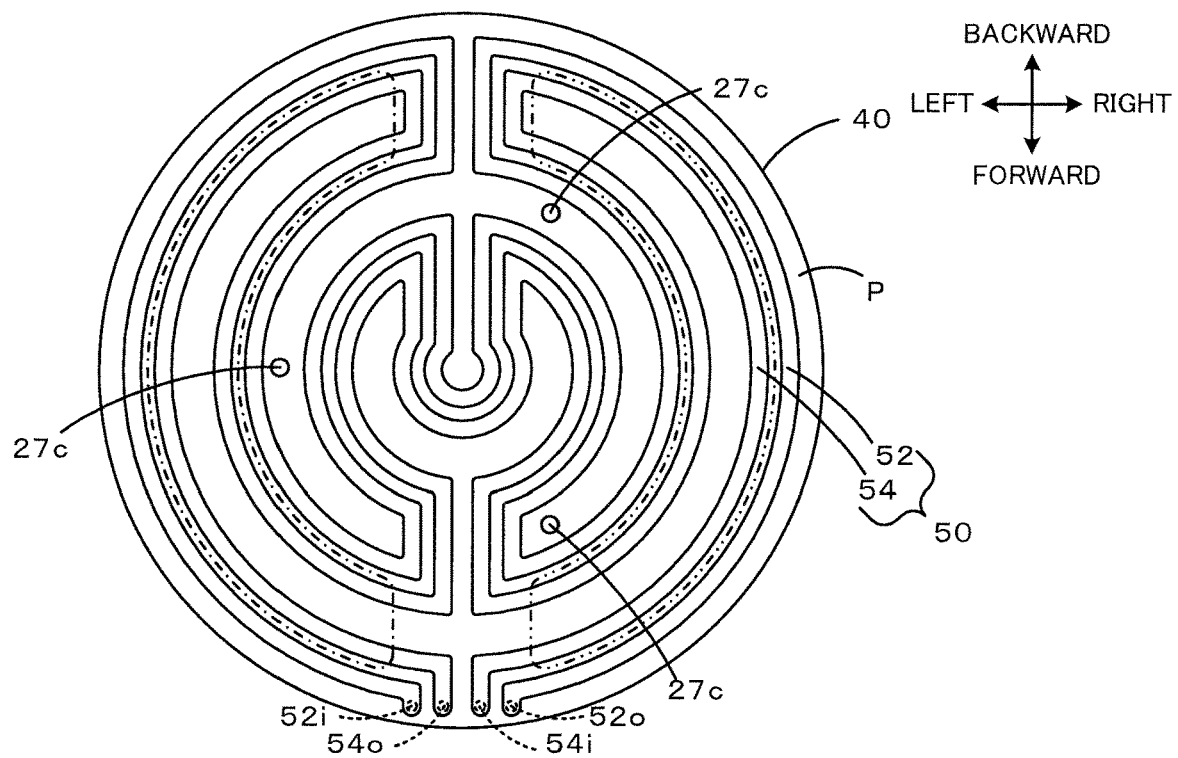
FIG. 6 is a sectional view of yet another modification of the cooling plate 40 taken along plane P.
Figure 7:
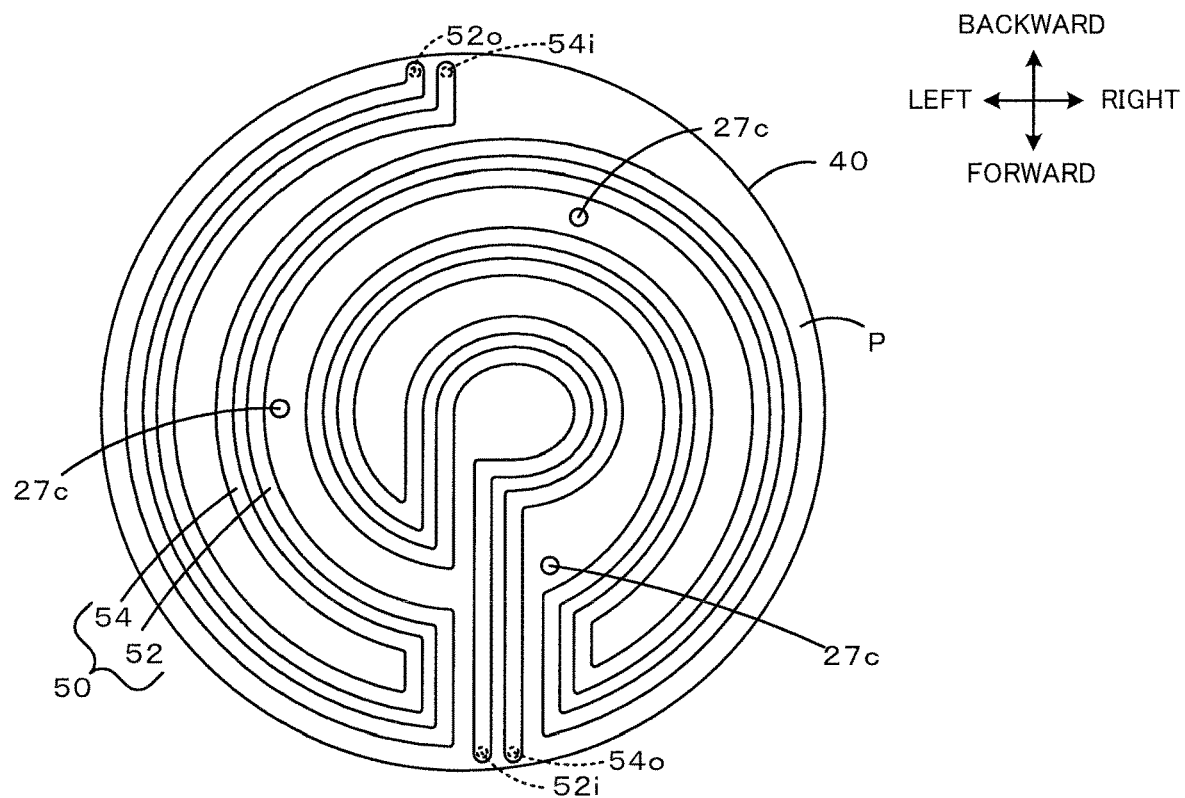
FIG. 7 is a sectional view of yet another modification of the cooling plate 40 taken along plane P.

The above embodiment may be modified such that the first and second passages 52 and 54 each have a shape other than a swirling shape. For example, as illustrated in FIG. 6 or 7, the first and second passages 52 and 54 may each have several turns while forming a single continuous line. In FIG. 6, the first passage 52 extends from the inlet 52i in a front-outer peripheral part and spreads over the left half in such a manner as to alternately form a substantially semicircular arc and an inward turn until reaching the central part. Then, the first passage 52 further spreads over the right half to the outlet 52o in the front-outer peripheral part in such a manner as to form a pattern symmetrical to the pattern on the left half. The second passage 54 extends along the first passage 52 from the inlet 54i positioned on the left side with respect to the outlet 52o of the first passage 52 to the outlet 54o positioned on the right side with respect to the inlet 52i of the first passage 52. In such an arrangement, the inlets 52i and 54i and the outlets 52o and 54o of the first and second passages 52 and 54 can be positioned close to one another.

Furthermore, in the region around the inlet 52i and the outlet 52o of the first passage 52, the part of the first passage 52 that is on the side nearer to the inlet 52i, the part of the second passage 54 that is on the side nearer to the outlet 54o, the part of the second passage 54 that is on the side nearer to the inlet 54i, and the part of the first passage 52 that is on the side nearer to the outlet 52o can be positioned adjacent to one another in that order. In FIG. 7, the first passage 52 extends linearly from the inlet 52i in the front-outer peripheral part to the central part. Then, from the central part, the first passage 52 alternately forms an almost circular arc and makes an outward turn toward the outer peripheral part until reaching the outlet 52o on the rear-outer peripheral part. The second passage 54 extends along the first passage 52 from the inlet 54i positioned on the right side with respect to the outlet 52o of the first passage 52 to the outlet 54o positioned on the right side with respect to the inlet 52i of the first passage 52. Alternatively, the first and second passages 52 and 54 may each have a zigzag shape.

The above embodiment and the modifications thereof may each be modified such that the inlet 52i and the outlet 52o of the first passage 52 are inversely positioned. In such a case, the inlet 54i and the outlet 54o of the second passage 54 are also inversely positioned.

The above embodiment and the modifications thereof each concern a case where a gap A (see FIG. 3) between the first passage 52 and the second passage 54 that are paired is smaller than a gap B between adjacent ones of the pairs. Alternatively, the gaps A and B may be of the same size. If the outlet-side part of the passages and the inlet-side part of the passages are alternately positioned as illustrated in FIGS. 3 to 5, it is preferable that the gap between the first passage 52 and the second passage 54 that are paired be of substantially the same size as the gap between adjacent ones of the pairs so that the degree of heat exchange between adjacent two passages becomes substantially the same for both sides of each passage. On the other hand, as illustrated in FIG. 6 or 7, if the outlet-side part of the passages is positioned adjacent to the outlet-side part of the passages (see the left area in FIG. 6 enclosed by a one-dot chain line, for example) or if the inlet-side part of the passages is positioned adjacent to the inlet-side part of the passages (see the right area in FIG. 6 enclosed by a two-dot chain line, for example), it is preferable that the gap between the first passage 52 and the second passage 54 that are paired be smaller than the gap between adjacent ones of the pairs so that heat exchange between each pair of the first passage 52 and the second passage 54 can be achieved smoothly.

The above embodiment and the modifications thereof each concern a case where the cooling plate 40 has the through-holes 27c to 29c. One or more of these through-holes may be omitted. Alternatively, the through-holes may include a gas hole through which He gas or the like is to be supplied to the surface of the ceramic plate 20, an insertion hole for inserting a sensor for measuring the temperature of the ceramic plate 20, or the like. The arrangement of the through-holes is not limited. However, it is preferable that the through-holes be each positioned between adjacent ones of the pairs of the first passages 52 and the second passages 54, not between the first passage 52 and the second passage 54. In such a case, heat exchange between the first passage 52 and the second passage 54 that are paired can be achieved smoothly.

The above embodiment and the modifications thereof may each be modified such that the ceramic plate 20 is divided into a plurality of zones in each of which the heater electrode 22 is embedded. In such a case, the temperature of the ceramic plate 20 can be controlled suitably for each of the zones. Furthermore, the cooling plate 40 may be divided into a plurality of zones in each of which both the first passage 52 and the second passage 54 are provided.

The above embodiment and the modifications thereof each concern a case where the ceramic plate 20 is provided with the heater electrode 22 and the electrostatic electrode 24 embedded therein. The types of the electrodes are not limited, as long as any electrodes are embedded in the ceramic plate 20. For example, at least one of the electrostatic electrode and the heater electrode may be embedded in the ceramic plate 20. Alternatively, an RF electrode may be embedded in the ceramic plate 20.

The present application is based on and claims priority from Japanese Patent Application No. 2019-058284 filed Mar. 26, 2019, the entire contents of which is incorporated herein by reference.

What is claimed is:

1. A wafer placement apparatus comprising:
a ceramic plate having an upper surface as a wafer placement surface and in which an electrode is embedded; and
a cooling plate provided on a lower surface, opposite the wafer placement surface, of the ceramic plate and a refrigerant passage is provided in the cooling plate, wherein
the refrigerant passage includes a first passage and a second passage, with each passage forming a single continuous line having an overall length that extends between a respective inlet and outlet of the passage, the first passage and the second passage extend along a single common plane that is parallel to the wafer placement surface so as to have an uppermost axial surface of both the first and the second passages be at a same axial distance from the wafer placement surface, and the first and the second passages are formed directly adjacent to each other as a pair that have a substantially same size radial gap therebetween that extends across an entirety of the overall length of the first and the second passages, which includes the respective inlet and outlet of the first and the second passages, and
the inlet of the first passage, the outlet of the second passage, the inlet of the second passage, and the outlet of the first passage are linearly adjacent to one another in that order in a central part of the cooling plate.

2. The wafer placement apparatus according to claim 1, wherein the first passage and the second passage each have a swirling shape.

3. The wafer placement apparatus according to claim 1, wherein the first passage and the second passage each swirl from the inlet in the central part to the outer peripheral part, make a turn in the outer peripheral part, and swirl back from the turn to the outlet in the central part.

4. A wafer placement apparatus comprising:
a ceramic plate having an upper surface as a wafer placement surface and in which an electrode is embedded; and
a cooling plate provided on a lower surface, opposite the wafer placement surface, of the ceramic plate and a refrigerant passage is provided in the cooling plate, wherein
the refrigerant passage includes a first passage and a second passage, with each passage forming a single continuous line having an overall length that extends between a respective inlet and outlet of the passage, the first passage and the second passage extend along a single common plane that is parallel to the wafer placement surface so as to have an uppermost axial surface of both the first and the second passages be at a same axial distance from the wafer placement surface, and the first and the second passages are formed directly adjacent to each other as a pair that have a substantially same size radial gap therebetween that extends across an entirety of the overall length of the first and the second passages, which includes the respective inlet and outlet of the first and the second passages,
the inlet of the first passage, the outlet of the second passage, the inlet of the second passage, and the outlet of the first passage are linearly adjacent to one another in that order in a central part of the cooling plate, and
the first passage forms a line running over the entirety of a region of the cooling plate over which the ceramic plate spreads.

5. The wafer placement apparatus according to claim 4, wherein the first passage and the second passage each have a swirling shape.

6. The wafer placement apparatus according to claim 4, wherein the first passage and the second passage each swirl from the inlet in the central part to the outer peripheral part, make a turn in the outer peripheral part, and swirl back from the turn to the outlet in the central part.

* * * * *